(12) United States Patent
Henington et al.

(10) Patent No.: US 6,274,010 B1
(45) Date of Patent: Aug. 14, 2001

(54) ELECTROPLATING APPARATUS

(75) Inventors: Paul Henington; Chun Pan Fung; Kwok Wah Li; Chi Chung Lee, all of Tai Po (HK)

(73) Assignee: Process Automation International Limited (HK)

( * ) Notice: Subject to any disclaimer, the term of this patent is extended or adjusted under 35 U.S.C. 154(b) by 0 days.

(21) Appl. No.: 09/114,122

(22) Filed: Jul. 13, 1998

Related U.S. Application Data (63) Continuation-in-part of application No. 08/998,368, filed on Dec. 24, 1997, now abandoned.

(30) Foreign Application Priority Data

Oct. 7, 1997 (GB) .................................................. 9721245
May 19, 1998 (GB) .................................................. 9810764

(51) Int. Cl.[7] .................................................. C25B 15/00
(52) U.S. Cl. .................................. 204/230.3; 204/DIG. 7
(58) Field of Search .......................... 204/DIG. 7, 204 R, 204/203.3

(56) References Cited

U.S. PATENT DOCUMENTS

| | | | |
|---|---|---|---|
| 4,879,007 | 11/1989 | Wong | 204/15 |
| 4,964,964 | 10/1990 | Murphy | 204/224 |
| 4,988,426 | 1/1991 | Metzka | 204/297 |
| 5,391,276 | 2/1995 | Astor et al. | 204/198 |
| 5,401,370 * | 3/1995 | Kauper et al. | 204/DIG. 7 X |
| 5,589,051 * | 12/1996 | Henington | 204/DIG. 7 X |
| 5,744,013 * | 4/1998 | Botts et al. | 204/287 X |
| 5,776,327 * | 7/1998 | Botts et al. | 204/DIG. 7 X |

FOREIGN PATENT DOCUMENTS

| | | |
|---|---|---|
| 3726571 C1 | 3/1989 | (DE) . |
| 4005209 A1 | 8/1991 | (DE) . |
| 0 666 343 A1 | 8/1995 | (EP) . |
| 712505 * | 10/1931 | (FR) . |

* cited by examiner

Primary Examiner—Donald R. Valentine
(74) Attorney, Agent, or Firm—Reese Taylor (57) ABSTRACT

An apparatus for electroplating at least one substrate is disclosed as including a trough, two anodes, at least one bath and two poly-tetrafluoroethylene sheets or a number of substantially rigid polypropylene plates, in which the trough supports the substrate and is in an electrically conductive relationship therewith, and the bath contains the anodes, the trough and an electrolyte, in which, in operation, an electric field exists in the electrolyte between the trough and the anodes, and in which the poly-tetrafluoroethylene sheets or the polypropylene plates are movable to vary the amount of electric current passing between the trough and the anodes.

5 Claims, 10 Drawing Sheets

ELECTROPLATING APPARATUS

This application is a continuation-in-part of Ser. No. 998,368, filed Dec. 24, 1997, and now abandoned.

This invention relates to an electroplating apparatus and is, in particular, concerned with such an apparatus with improvements in the uniform distribution of metal on substrates to be electroplated, e.g. printed circuit boards.

BACKGROUND OF THE INVENTION

U.S. Pat. No. 4,879,007 discloses a floating shield for use in an electrolytic bath. The shield includes an elongated trough in which substrates are loaded for plating. The substrates are held in the trough in a vertical plane, and with the lower edges of the substrates below the plane of the upper edges of the trough. Immersed into the bath are a pair of anodes, each extending parallel to the longitudinal axis of the floating shield. The substrates loaded in the trough are connected to a cathode bus bar by one or more clamps. In operation, electric current passes between the anodes and the cathode bus bar through electrolyte contained in the bath, and thereby to electroplate the substrates.

When a plating factory orders an electroplating apparatus from a manufacturer, it is necessary to specify the "board size" of the substrates intended to be plated by the apparatus. In this connection, "board size" means the vertical length of the substrate when such is held in a vertical plane. It is also a usual practice in the relevant field to so arrange the depth of the floating shield in the bath that the top edge of the substrates is of a fixed distance from the top edge of the bath. The manufacturer will then arrange the dimensions of the bath, the anodes and the depth of the trough in the bath such that there will be a satisfactory and uniform electroplating result. It is found in practice that if substrates of a board size shorter than the intended board size are electroplated in the bath, the lower edges of the substrates will be "over-plated". This is known as "edging effect" and means that the metal deposited on or around the lower edges of the substrates is thicker than that deposited in the rest of the substrates.

While it is possible to reduce this "edging effect" by changing the anodes used in each electroplating task, as there may be over forty anodes in a single tank, and they are very heavy, it is very difficult and not practical to replace anodes.

It is therefore an object of the present invention to provide an improved electroplating apparatus in which the aforesaid shortcoming is mitigated, or at least to provide a useful alternative to the trade.

SUMMARY OF THE INVENTION

According to the present invention, there is provided an apparatus for electroplating at least one substrate, comprising support means, anode means, at least one container and blocking means, wherein said support means supports said substrate and is in an electrically conductive relationship therewith, wherein said container contains said anode means, said support means and an electrolyte, wherein in operation, an electric field exists in said electrolyte between said support means and said anode means, and wherein said blocking means is movable to vary the amount of electric current passing between said support means and said anode means.

Advantageously, said blocking means may be movable by said support means.

Conveniently, said blocking means may be movable to vary the amount of electric current passing between a bottom part of said support means and said anode means.

Suitably, said blocking means may be made substantially of an electrically insulating material.

Said insulating material may advantageously be polytetrafluoroethylene.

Said blocking means may conveniently comprise a plurality of sheet members.

Said sheet members may suitably be movable away from each other.

Advantageously, said blocking means may be elastic.

Conveniently, said blocking means may comprise a plurality of substantially rigid blocking members.

Suitably, said apparatus may comprise at least two plates to each of which at least one blocking member is hingedly engaged.

Said blocking members may advantageously be pivotally movable relative to the plate to which it is hingedly engaged.

Said blocking members may conveniently be made substantially of polypropylene.

BRIEF DESCRIPTION OF THE DRAWINGS

The present invention will now be described by way of an example and with reference to the accompanying drawings, in which.

DETAILED DESCRIPTION OF THE PREFERRED EMBODIMENTS

Figure 1:
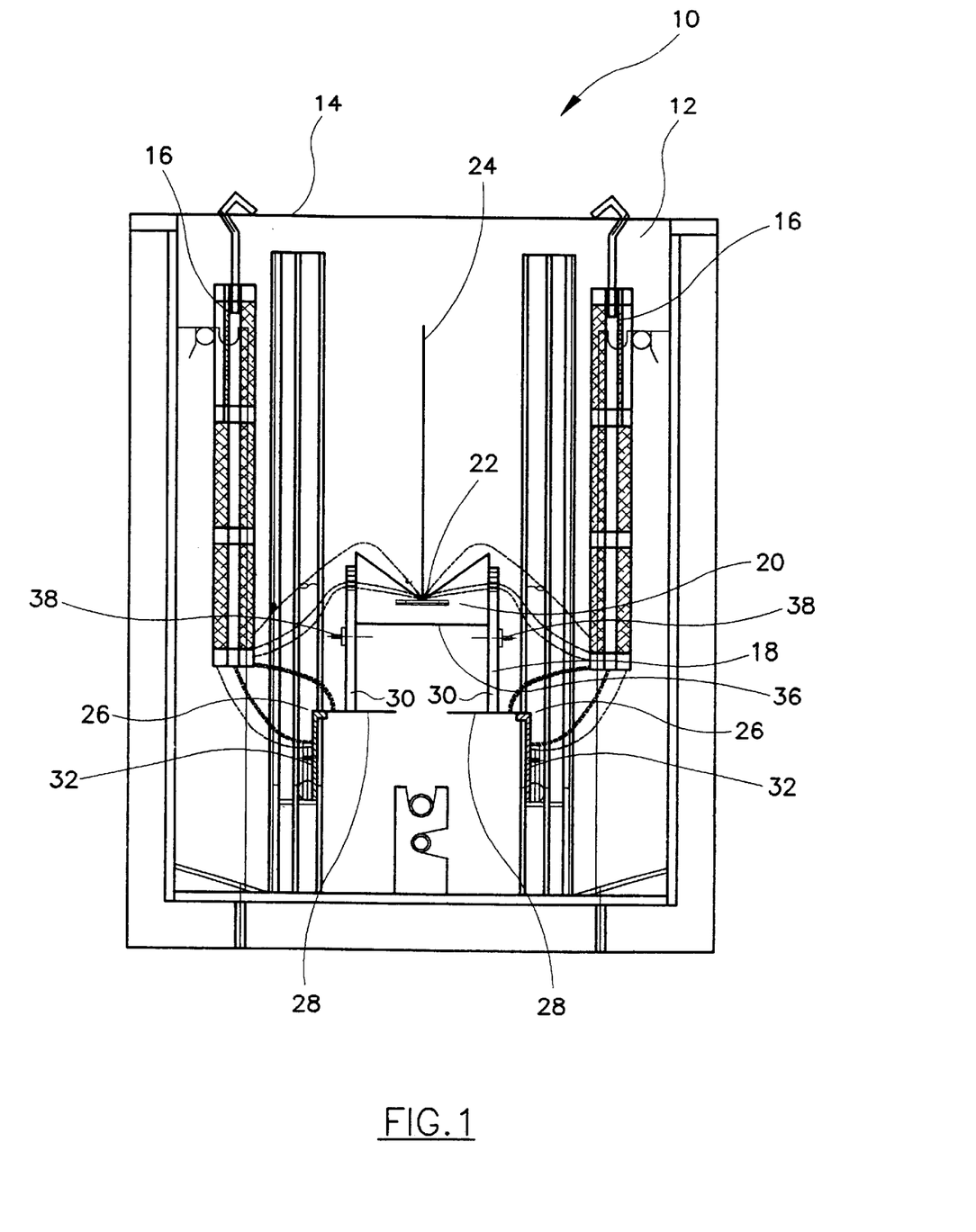
FIG. 1 is a schematic diagram showing a first embodiment of an electroplating apparatus according to the present invention in which the trough is loaded with a substrate of a vertical length of 18 inches.

As shown in FIG. 1, a first embodiment of an electroplating apparatus according to the present invention is designated generally as 10. The electroplating apparatus 10 includes a bath 12 for containing an electrolyte which, for clarity purposes, is not shown in any of these drawings. Depending from an upper edge 14 of the bath 12 are two rows of anodes 16, of which only two are shown here. Within the bath 12 is a trough 18, which may be lowered into the bath 12 or raised therefrom. The trough 18 includes a number of receiving plates 20, only one of which is shown here. Each receiving plate 20 includes a V-shaped notch in which an lower edge 22 of a substrate 24 to be plated, e.g. a printed circuit board, may be received, so that the substrate 24 is held in a substantially vertical plane. In FIG. 1, the vertical length of the substrate 24 is 18 inches. On either side of the trough 18 is an electrically insulating polypropylene diaphragm 26, details of which are shown in FIG. 2 and to be discussed below.

Attached to each of the polypropylene diaphragms 26 is an elastic and electrically insulating poly-tetrafluoroethylene sheet 28 which extends across the length of the bath 12. The poly-tetrafluoroethylene 28 sheets assume a generally horizontal configuration in the bath 12. The poly-tetrafluoroethylene sheets 28 are of a thickness of about 0.5mm.

The trough 18 includes two side boards 30 which, when substrates 24 of a vertical length of 18 inches are loaded into the receiving plates 20, just contact and bear on the upper surface of the poly-tetrafluoroethylene sheets 28.

Figure 2:
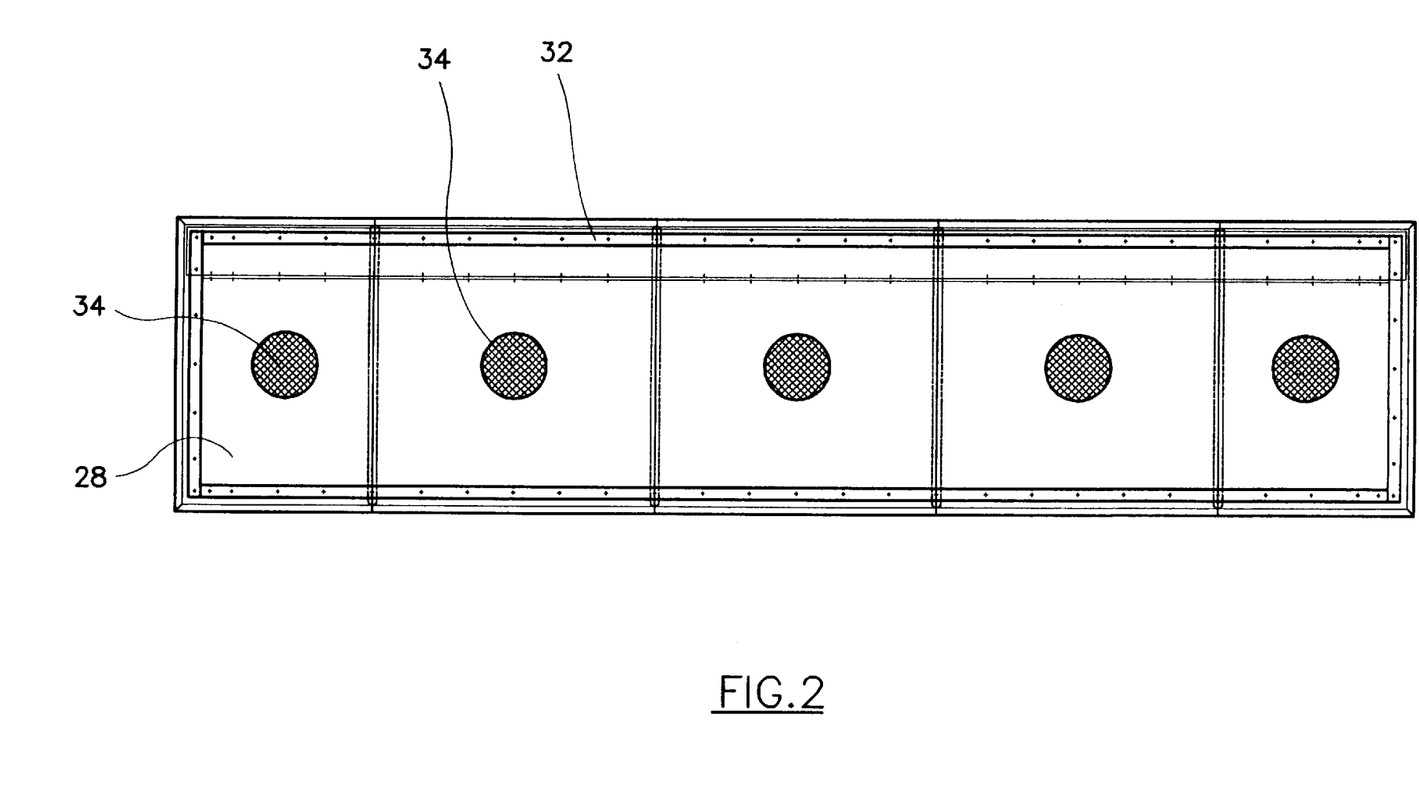
FIG. 2 is a side view of a polypropylene diaphragm used in the present invention.

Turning to FIG. 2, a polypropylene diaphragm 26 is shown as including an outer impermeable electrically insulating polypropylene frame 32, with a perforated cloth 34 made of electrically insulating polypropylene mesh material stretched across the inner open area. In this figure, for clarity purposes, only some areas (the five circular areas) of the cloth 34 are shown as perforated. It should however be understood that the whole cloth 34 is perforated. It is apparent that, with such an arrangement, while an electric field can exist across the perforated cloth 34, no electric field can exist across the polypropylene frame 32. The polypropylene diaphragm 26 effectively divides the bath 12 into a central "cathode compartment" and two outer "anode compartments". The holes in the perforated cloth 34 are so sized as to prevent particles such as anode sludge from passing into the central "cathode compartment", while allowing free movement of the electrolyte therethrough.

As can be seen in FIG. 1, although an electric field (as denoted by the hashed lines) can exist across the polypropylene diaphragm 26, no electric current can pass from under the bottom part 36 of the trough 18 since such is blocked by the poly-tetrafluoroethylene sheets 28 and/or the polypropylene frame 32. Since the amount of electric current reaching the lower end of the substrate 24 is reduced, less metal will be deposited in this area, thus reducing the "edging effect".

Figure 3:
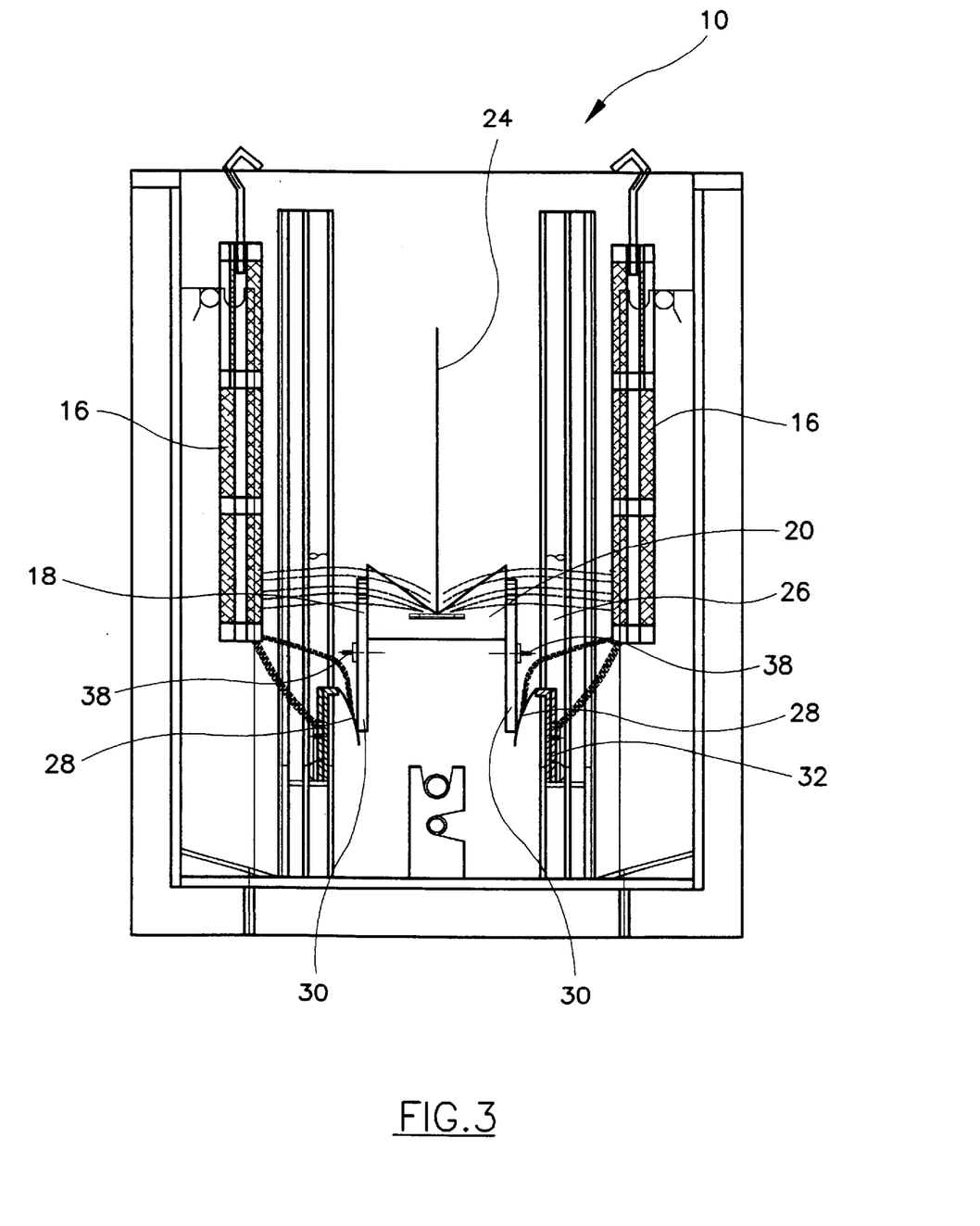
FIG. 3 is a schematic diagram of the electroplating apparatus shown in FIG. 1 in which the trough is loaded with a substrate of a vertical length of 21 inches.

Turning to FIG. 3, the same electroplating apparatus 10 according to the present invention is shown. The substrate 24 received by the receiving plate 20 of the trough 18 is now of a vertical length of 21 inches. It can be seen that while some electric current passes between the anodes 16 and the lower part of the substrate 24, part of the current is blocked by the impermeable electrically insulating polypropylene frame 32 of the polypropylene diaphragm 26. It can also be seen that when the trough 18 is lowered into the bath 12, the side plates 30 push the poly-tetrafluoroethylene sheets 28 away from each other. Due to their elasticity, when the trough 18 is raised from the bath 12, e.g. after plating, the poly-tetrafluoroethylene sheets 28 will resume their position as shown in FIG. 1. As shown in FIG. 3, the side boards 30 are in contact with the poly-tetrafluoroethylene sheets 28, so that there are no gaps between the side boards 30 and the poly-tetrafluoroethylene sheets 28 through which electric current can pass through. However, as compared with the situation in FIG. 1, more electricity passes between the anodes 16 and the lower part of the substrate 24.

Figure 4:
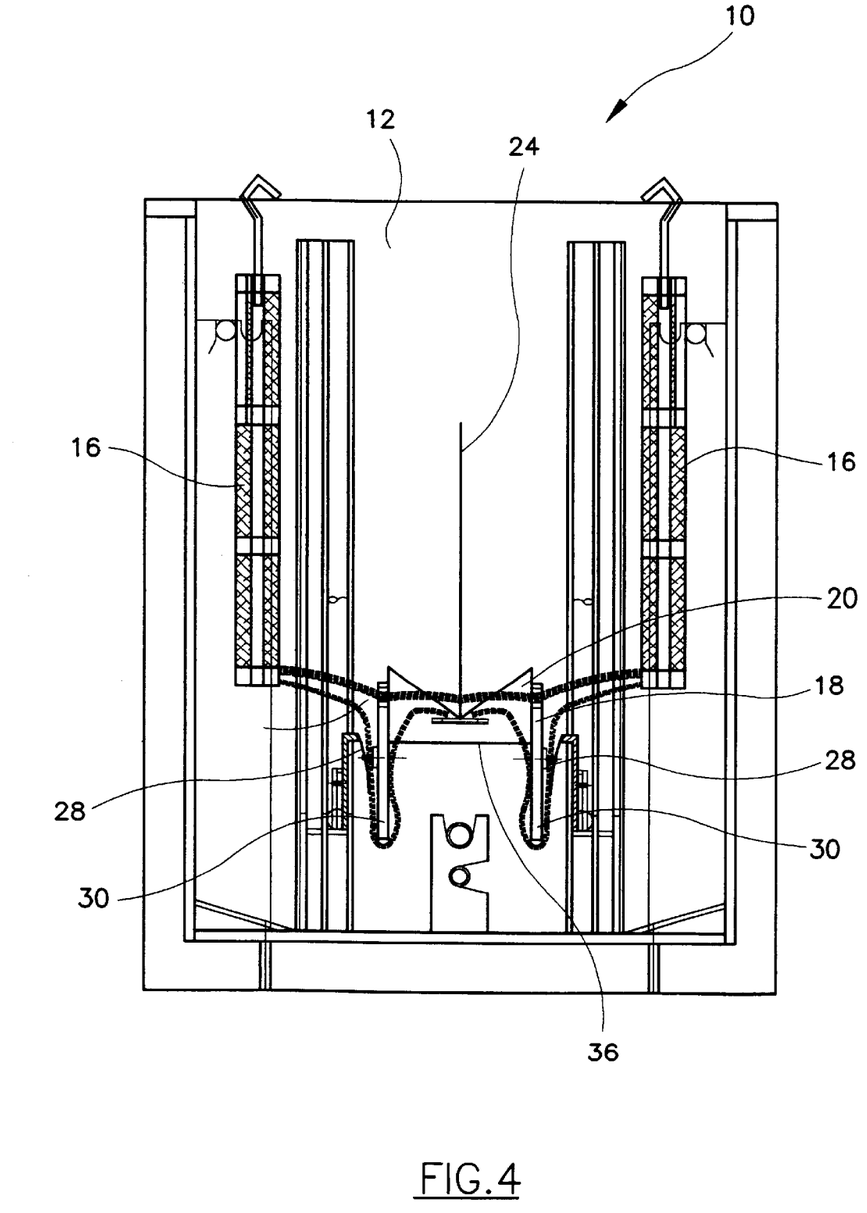
FIG. 4 is a schematic diagram of the electroplating apparatus shown in FIG. 1 in which the trough is loaded with a substrate of a vertical length of 24 inches.

As to FIG. 4, again, the same electroplating apparatus 10 according to the present invention is shown. The substrate 24 received by the receiving plate 20 of the trough 18 is now of a vertical length of 24 inches. It can be seen that the trough 18 is much nearer to the bottom of the bath 12. As the trough 18 is lowered further towards the bottom of the bath 12, two rows of fingers 38 (only two are shown here for clarity purposes) of the trough 18 push the poly-tetrafluoroethylene sheets 28 further away from each other, so that gaps exist between the side boards 30 and the poly-tetrafluoroethylene sheets 28. As shown clearly in FIG. 4, more electric current can pass between the anodes 16 and bottom part 36 of the trough 18.

Figure 5:
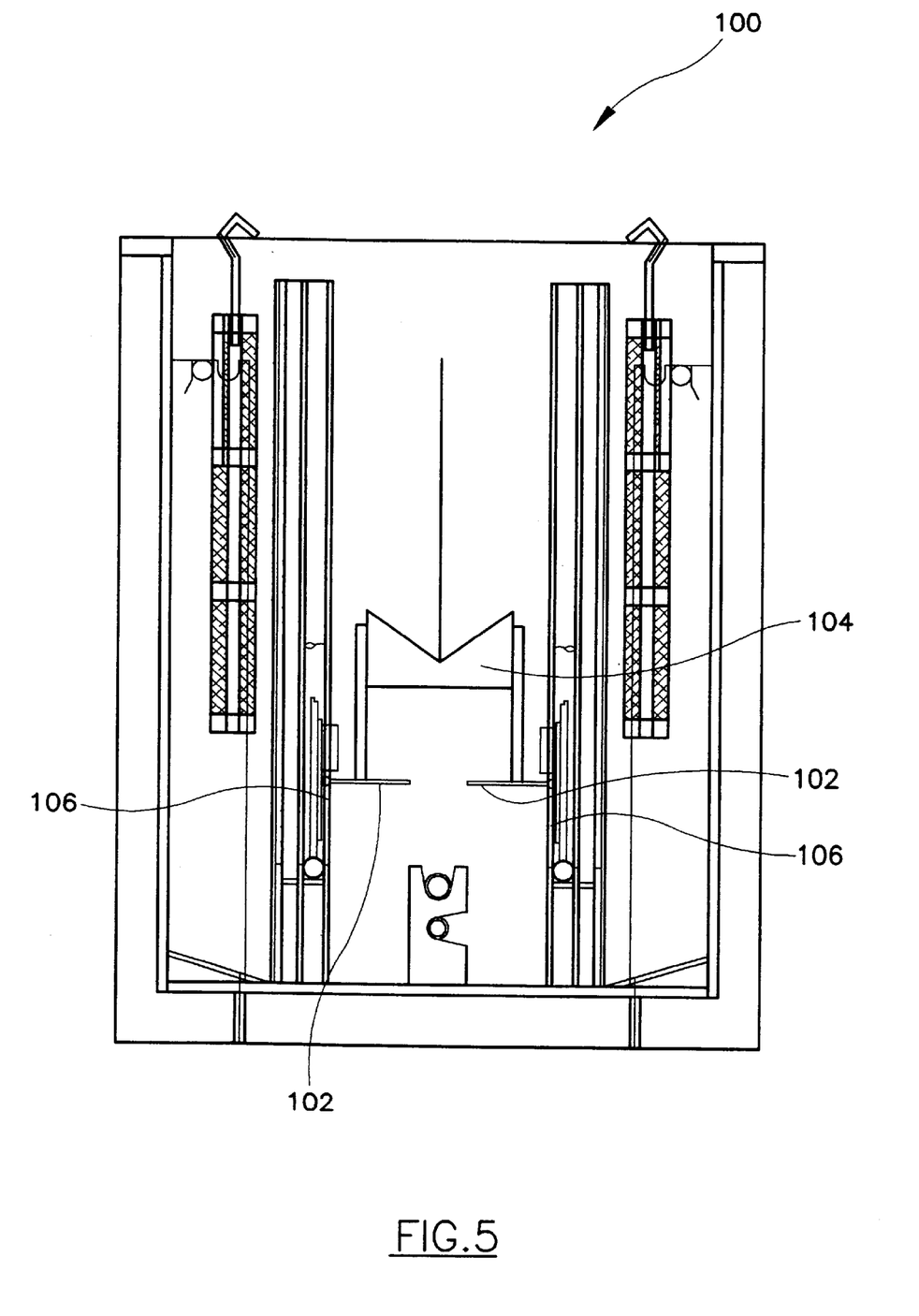
FIG. 5 is a schematic diagram showing a second embodiment of an electroplating apparatus according to the present invention in which the trough is loaded with a substrate of a vertical length of 18 inches.

A second embodiment of an electroplating apparatus is shown in FIG. 5 as generally designated as 100. The structure of the electroplating apparatus 100 is essentially the same as that in the electroplating apparatus 10 shown in FIGS. 1 to 4, except that the elastic poly-tetrafluoroethylene sheets 28 are replaced by a number of rigid electrically insulating blocking plates 102 which are made of polypropylene, the structure of which will be discussed below.

Figure 6:
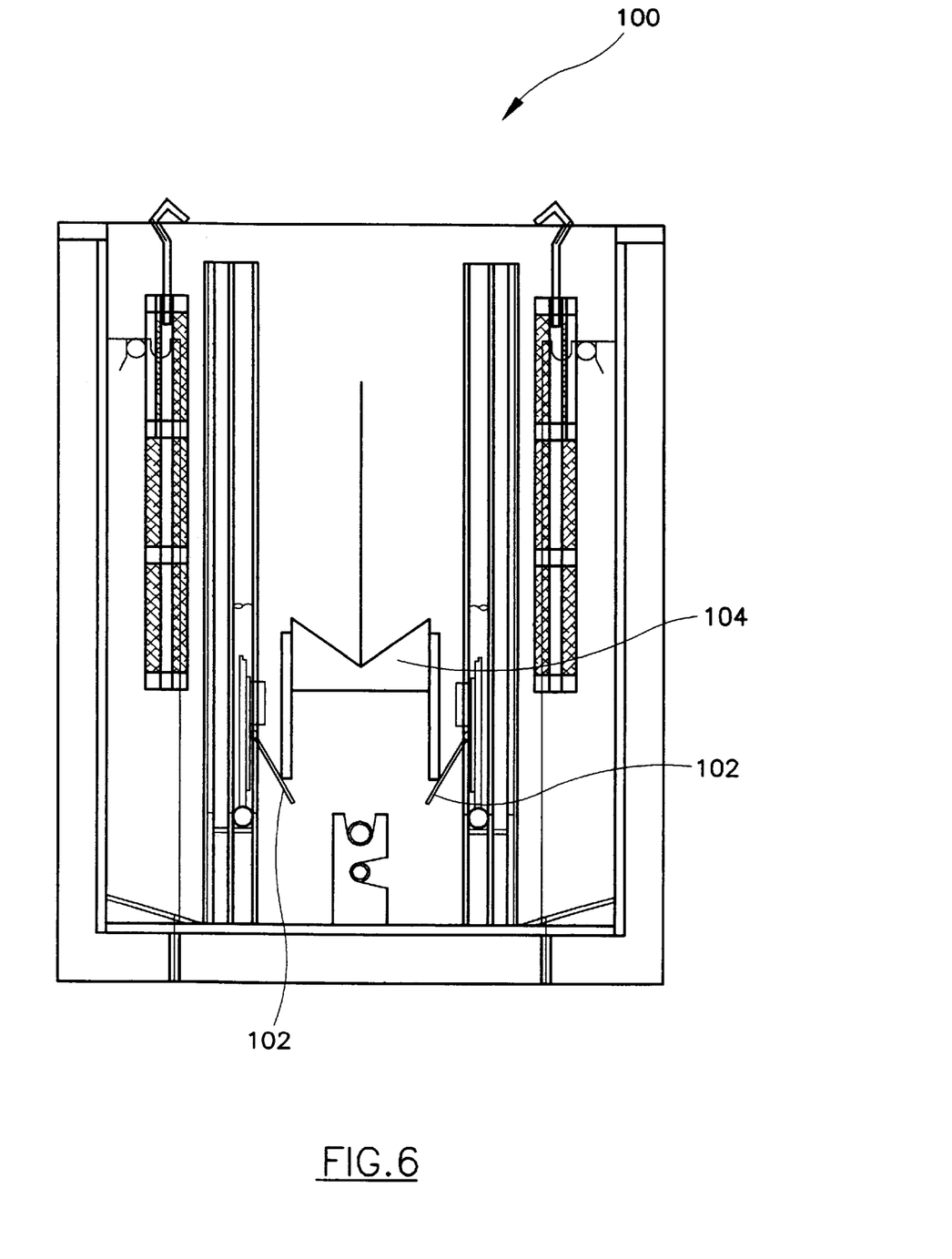
FIG. 6 is a schematic diagram of the electroplating apparatus shown in FIG. 5 in which the trough is loaded with a substrate of a vertical length of 21 inches.
Figure 7:
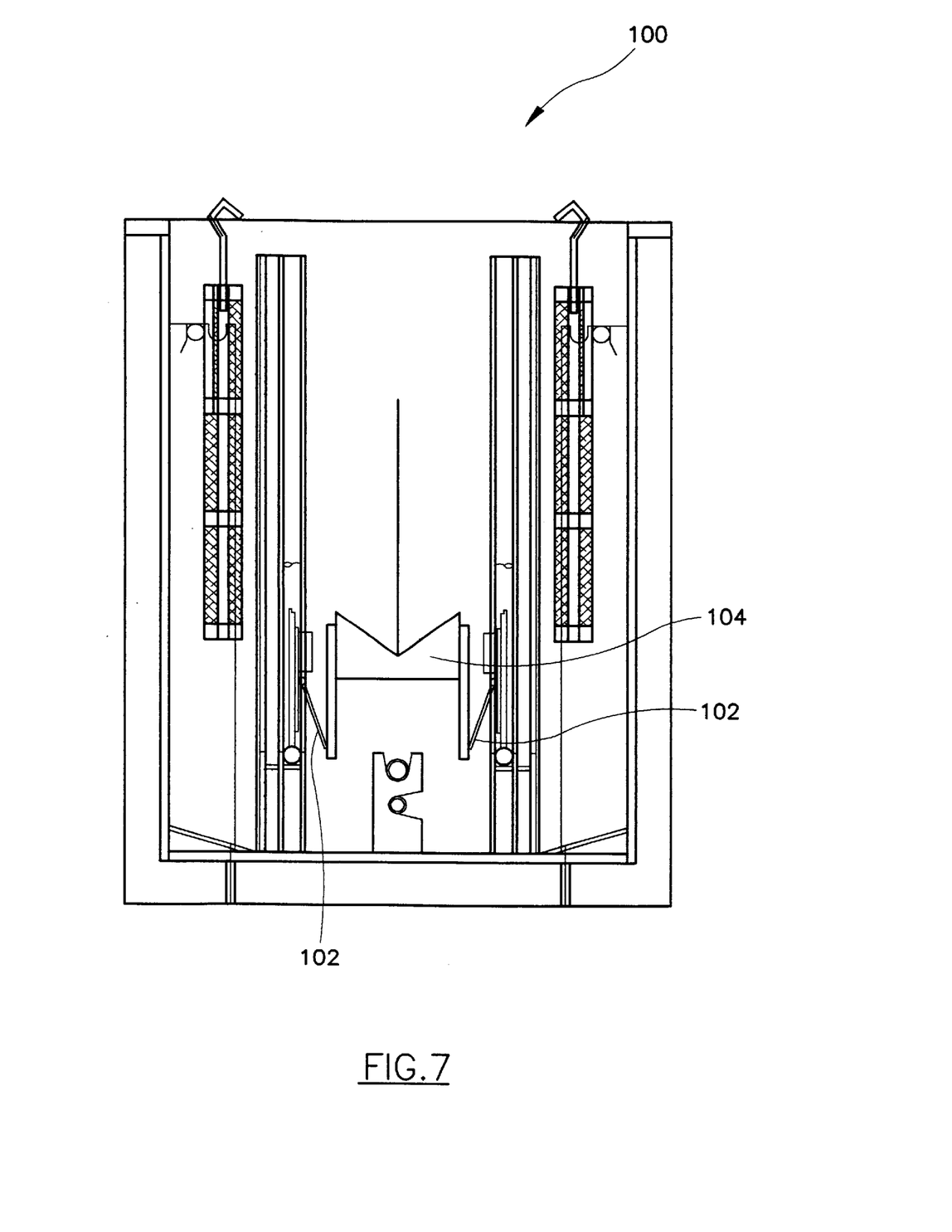
FIG. 7 is a schematic diagram of the electroplating apparatus shown in FIG. 5 in which the trough is loaded with a substrate of a vertical length of 24 inches.

As shown in FIGS. 5 to 7, the blocking plates 102 operate in essentially the same way as the elastic poly-tetrafluoroethylene sheets 28, and can be pushed away from each other when a trough 104 is immersed downward. The density of the blocking plates 102 is such that they will float and assume the position as shown in FIG. 5 in the electrolyte unless they are acted upon by the trough 104.

Figure 8A:
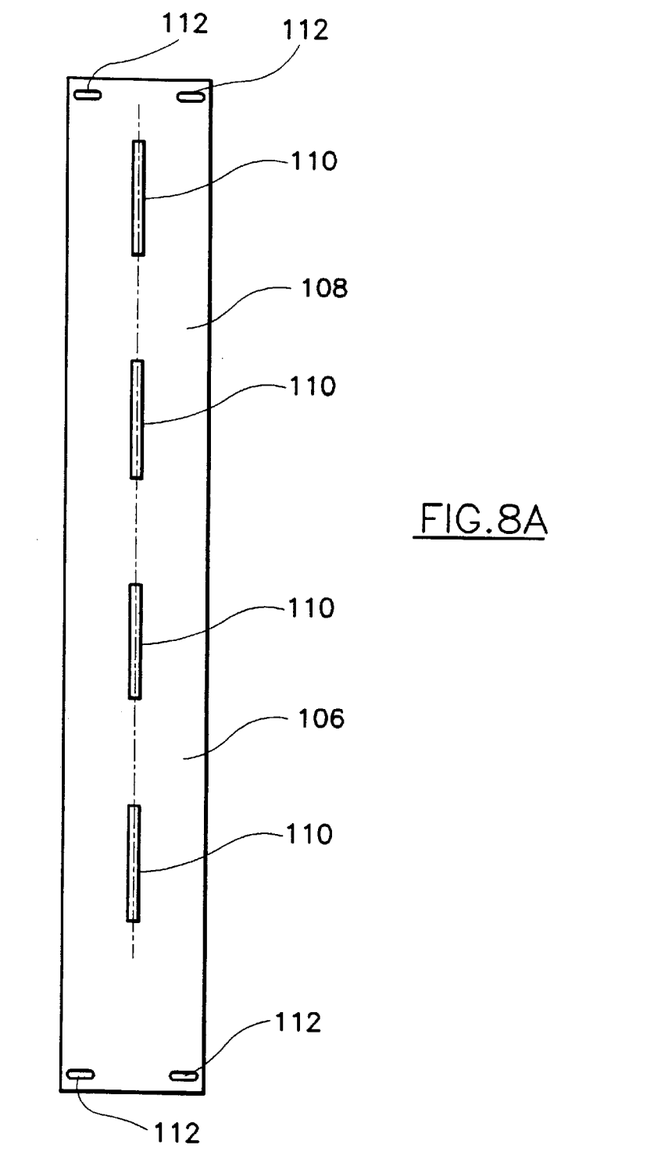
FIGS. 8A and 8B are respectively a side view and an end view of a side plate used in the electroplating apparatus shown in FIG. 5.
Figure 8B:
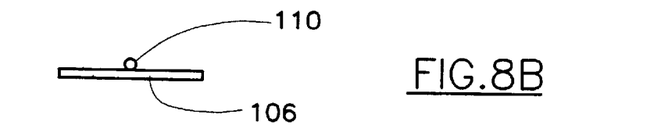
Figure 9A:
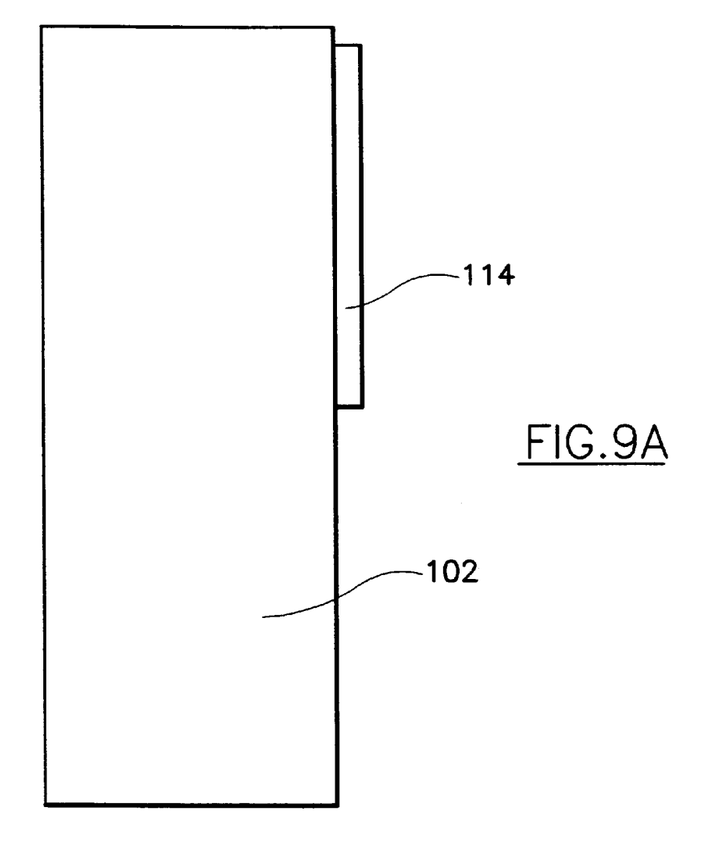
FIGS. 9A and 9B are respectively a side view and an end view of a blocking plate used in the electroplating apparatus shown in FIG. 5.
Figure 9B:
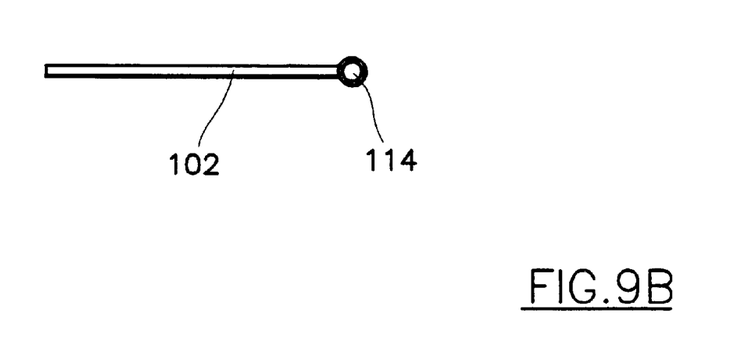
Figure 10:
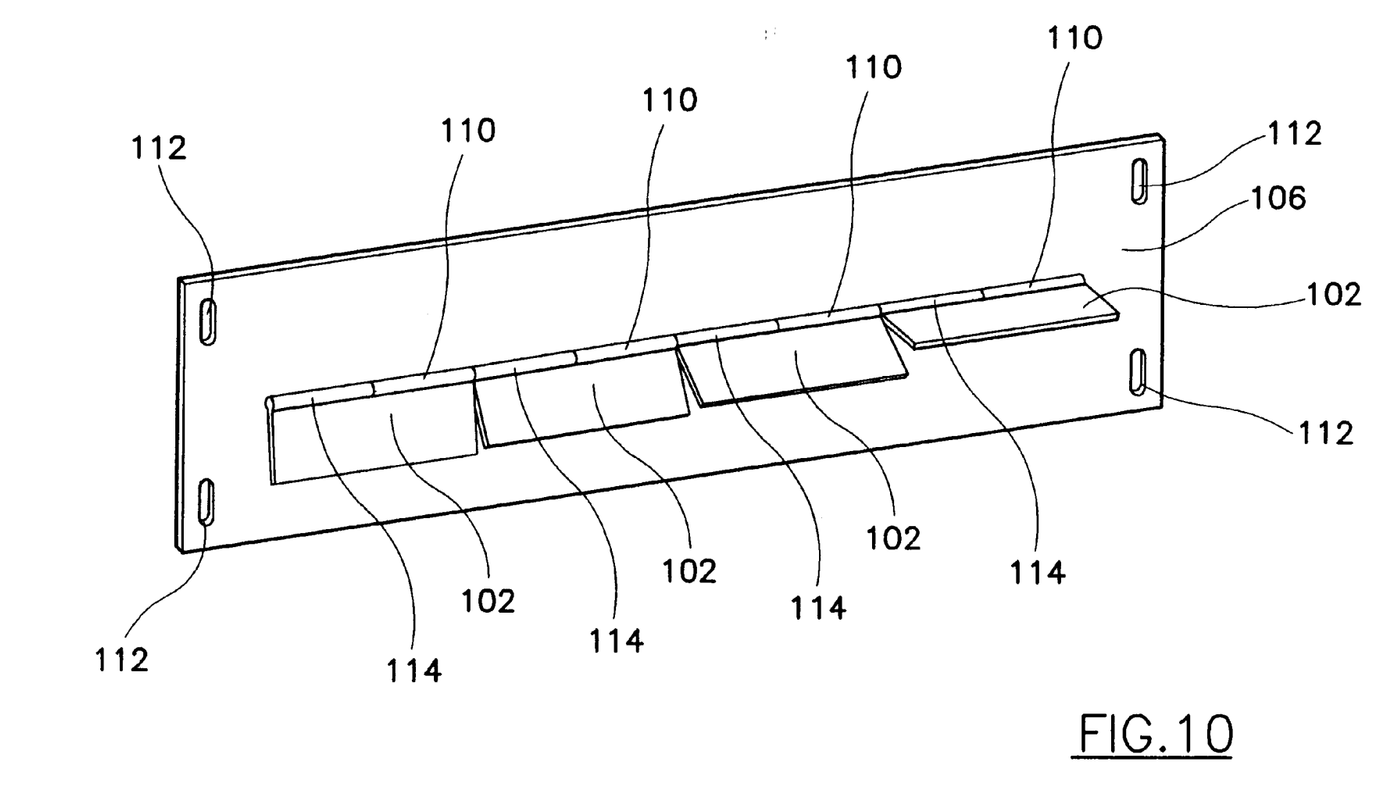
FIG. 10 is a perspective view showing the engagement between the side plate and the blocking plates in the electroplating apparatus shown in FIG. 5.

FIGS. 8A and 8B show a side plate 106 with which the blocking plates 102 may be engaged. The side plate 106 includes a back plate 108 fixed with four rods 110. The side plate 106 includes four holes 112 for enhancing securing thereof to the apparatus 100. FIGS. 9A and 9B show the blocking plate 102 as also including a rod 114. As shown in FIG. 10, the rod 114 of each of the blocking plates 102 may be engaged with one of the rods 110 so as to enable the blocking plates 102 to pivot relative to the side plate 106 when acted upon by the trough 104.

From the foregoing discussion, it can be clearly seen that the performance of an electroplating apparatus according to the present invention is versatile and flexible, and can provide satisfactory plating performance of substrates over a wide range of board sizes.

It should, however, be noted that the above only describes an embodiment whereby the present invention may be carried out, and modifications and alterations may be made thereto without departing from the spirit of the present invention.

What is claimed is:

1. An apparatus for electroplating at least one substrate, comprising at least one anode member, at least one blocking member, at least one container, and means adapted to support said substrate in said container and adapted to be in an electrically conductive relationship with said substrate, wherein said container contains said at least one anode member, said support means and said at least one blocking member, and said container is adapted to contain an electrolyte, wherein in operation, an electric field exists in said electrolyte between said support means and said at least one anode member, wherein said blocking member is movable by said support means to vary the amount of electric current passing between said support means and said at least one anode member, and wherein said blocking member is positionable between said support means and said at least one anode member and movable between a first position in which it is substantially horizontal, and a second position in which it extends generally downwardly.

2. An apparatus according to claim 1, wherein each or said blocking member is made of an electrically insulating material.

3. An apparatus according to claim 2, wherein said blocking member is made predominantly of polytetrafluoroethylene.

4. An apparatus according to claim 1, wherein each or said blocking member is elastic.

5. An apparatus according to claim 1, further including a plurality of blocking members.

* * * * *